(12) United States Patent
Asano et al.

(10) Patent No.: US 6,882,210 B2
(45) Date of Patent: Apr. 19, 2005

(54) SEMICONDUCTOR SWITCHING DEVICE

(75) Inventors: Tetsuro Asano, Oizumi-machi (JP); Hitoshi Tsuchiya, Nara (JP); Toshikazu Hirai, Oizumi-machi (JP)

(73) Assignee: Sanyo Electric Co. Ltd., Osaka (JP)

( * ) Notice: Subject to any disclaimer, the term of this patent is extended or adjusted under 35 U.S.C. 154(b) by 0 days.

(21) Appl. No.: 10/016,143

(22) Filed: Dec. 17, 2001

(65) Prior Publication Data

US 2002/0153585 A1 Oct. 24, 2002

(30) Foreign Application Priority Data

| Apr. 19, 2001 | (JP) | .................................... | 2001-121292 |
| Apr. 19, 2001 | (JP) | .................................... | 2001-121293 |
| May 11, 2001 | (JP) | .................................... | 2001-141894 |

(51) Int. Cl.$^7$ .............................................. H03K 17/28
(52) U.S. Cl. ....................... 327/403; 327/404; 327/407; 257/192; 257/368; 257/369; 326/113
(58) Field of Search ................................ 327/403, 407, 327/404, 408, 113; 326/113; 257/192, 368, 369, 194, 195, 280, 281, 282, 288, 289, 379, 380, 472, 275, 364

(56) References Cited

U.S. PATENT DOCUMENTS

| 5,200,362 A | 4/1993 | Lin et al. |
| 5,548,239 A | 8/1996 | Kohama |
| 5,776,798 A | 7/1998 | Quan et al. |
| 5,976,912 A | 11/1999 | Fukutomi et al. |
| 6,001,671 A | 12/1999 | Fjelstad |
| 6,124,736 A * | 9/2000 | Yamashita et al. .......... 326/113 |

FOREIGN PATENT DOCUMENTS

| JP | 63-20041 | 4/1988 |
| JP | 04-146667 | 5/1992 |
| JP | 06-029811 | 2/1994 |
| JP | 06-334506 | 12/1994 |
| JP | 07-303001 | 11/1995 |
| JP | 08-070245 | 3/1996 |
| JP | 08-195667 | 7/1996 |
| JP | 08-204528 | 8/1996 |
| JP | 08-204530 | 8/1996 |
| JP | 08-213891 | 8/1996 |
| JP | 08-293776 | 11/1996 |
| JP | 09-008501 | 1/1997 |
| JP | 09-055682 | 2/1997 |

OTHER PUBLICATIONS

Kohama et al. "High Power DPDT Antenna Switch MMIC for Digital Cellular Systems" IEEE Journal of Solid–State Circuits, 31(10), 1996, pp. 1406–1411.

Nogawa et al. "Compact GaAs ICs for PHS" Sanyo Technical Review 29(1), 1997, pp. 52–59.

* cited by examiner

Primary Examiner—Minhloan Tran
Assistant Examiner—Tan Tran
(74) Attorney, Agent, or Firm—Morrison & Foerster LLP

(57) ABSTRACT

A switching device receives two pairs of balanced signals and outputs one of the two pairs of the signals. The device is composed of two SPDT switches which share two control signals provided to the gates of the FET of the SPDT switches. The package of the device has eight external electrodes on the back side of the package. The eight external electrodes are configured so that they are aligned symmetrically with respect to the center line of the package. The device requires only a small package space and is suitable for mobile communication application such as cell phone accommodating CDMA and GPS signals.

15 Claims, 19 Drawing Sheets

PRIOR ART

SEMICONDUCTOR SWITCHING DEVICE

BACKGROUND OF THE INVENTION

1. Field of the Invention

The invention relates to a semiconductor switching device for switching at high frequencies, especially to a compound semiconductor switching device comprising two switches connected to each other.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) made on a gallium arsenide (GaAs) substrate, as this material is suitable for use at high frequencies, and developments have been made in forming a monolithic microwave integrated circuit (MMIC) by integrating the aforementioned switching circuits.

FIG. 1A is a cross-sectional view of a conventional GaAs FET. The GaAs substrate 1 is initially without doping, and has beneath its surface an n-type channel region (or a channel layer) 2 formed by doping with n-type dopants. A gate electrode 3 is placed on the surface of the channel region 2 forming a Schottky contact, and a source electrode 4 and drain electrode 5 are placed on both sides of the gate electrode 3 forming ohmic contacts to the surface of the channel region 2. In this transistor configuration, a voltage applied to the gate electrode 3 creates a depletion layer within the channel region 2 beneath the gate electrode 3 and thus controls the channel current between the source electrode 4 and the drain electrode 5.

FIG. 1B shows the basic circuit configuration of a conventional compound semiconductor switching device called a SPDT (Signal Pole Double Throw), using GaAs FETs. One of the source electrode and the drain electrode of each FET (FET1 and FET2) is connected to a common output electrode OUT. Another of the source electrode and the drain electrode of each FET (FET1 and FET2) is connected to respective input terminal pads (IN1 and IN2). The gates of FET1 and FET2 are connected to the control terminal pads Ctl-1, Ctl-2 through resistors R1, R2, respectively. A complementary signal is applied to the two control terminal pads, Ctl-1, Ctl-2. When a high level signal is applied to the control terminal pad of one of the FETs, the FET changes to an on-state, and a signal passes through the FET and reaches the common output terminal pad OUT. The role of the resistors R1 and R2 is to prevent the leaking of the high frequency signals through the gate electrodes to the DC voltages applied to the control terminal pads (Ctl-1 and Ctl-2), which are substantially grounded at high frequency.

When a mobile communication device can use two kinds of communication methods, for example, CDMA and GPS, the switching device of the communication device needs to alternate between the two communication methods. However, in many instances, the signals of these communication methods are provided as two balanced signals, which have opposite phases (180 degree difference) from one another. Accordingly, two separate switches are required for this kind of device and occupy a large space corresponding to the two switches and their wiring in the device.

SUMMARY OF THE INVENTION

The invention provides a semiconductor switching circuit device formed on a substrate. The device has first, second, third and fourth field-effect transistors each having a source electrode, a gate electrode and a drain electrode which are formed on a channel layer of the substrate. The device also has first, second, third and fourth input terminal pads corresponding to the first, second, third and fourth transistors. The source electrode or the drain electrode of each of the four transistors is connected to the corresponding input terminal pad. The device has a first common output terminal pad connected to the source electrode or the drain electrode of the first transistor and connected to the source electrode or the drain electrode of the second transistor. These two electrodes connected to the first common output terminal pad are not connected to any of the input terminal pads. The device also has a second common output terminal pad connected to the source electrode or the drain electrode of the third transistor and connected to the source electrode or the drain electrode of the fourth transistor. These two electrodes connected to the second common output terminal pad are not connected to any of the input terminal pads. For manipulating signal inputs and outputs, the device has a first control terminal pad connected to the gate electrodes of the first and third transistors, and a second control terminal pad connected to the gate electrodes of the second and fourth transistors.

The invention also provides a switching device having a semiconductor chip formed on a substrate which includes four input terminal pads, two common output terminal pads and only two control terminal pads. The device also includes an insulating board having a conductor pattern for mounting the chip, a plurality of external electrodes connected to corresponding terminal pads of the chip, and a resin layer covering the chip and the insulating board. Each of the external electrodes is disposed near the corresponding terminal pad so that the external electrodes are aligned symmetrically with respect to the center line of the insulating board.

The invention further provides a switching device having a semiconductor chip formed on a substrate which includes four input terminal pads, two common output terminal pads and only two control terminal pads. The device also includes an insulating resin film in which a conductor pattern and the semiconductor chip are embedded, and a plurality of external electrodes connected to corresponding terminal pads of the chip. Each of the external electrodes is disposed near the corresponding terminal pad so that the external electrodes are aligned symmetrically with respect to the center line of the insulating resin film.

The invention also provides a semiconductor switching circuit device having a first switch including two field-effect transistors each having a source electrode, a gate electrode, a drain electrode and an input terminal pad, and a common output terminal pad for the two transistors of the first switch. The source electrode or the drain electrode of each of the two transistors of the first switch is connected to the common output terminal pad of the first switch. The source electrode and the drain electrode of each of the two transistors of the first switch, which is not connected to the common output terminal pad, is connected to the input terminal pad. The device also has a second switch including two field-effect transistors each having a source electrode, a gate electrode, a drain electrode and an input terminal pad, and a common output terminal pad for the two transistors of the second switch. The source electrode or the drain electrode of each of the two transistors of the second switch is connected to the common output terminal pad of the second switch. The source electrode or the drain electrode of each of the two transistors of the second switch, which is not connected to the common output terminal pad, is connected to the input terminal pad. The device further has two control terminal pads. One of the two control terminal pads is connected to the gate electrode of one of the two transistors of the first switch and a gate electrode of one of the two transistors of the second switch. Another of the two control terminal pads is connected to a gate electrode of another of the two transistors of the first switch and a gate electrode of another of the two transistors of the second switch.

The invention further provides a semiconductor switching circuit device including four input terminal pads, two common output terminal pads and no more than two control terminal pads.

DETAILED DESCRIPTION OF THE INVENTION

Embodiments of this invention will be described hereinafter in reference to the above drawings.

Figure 2:
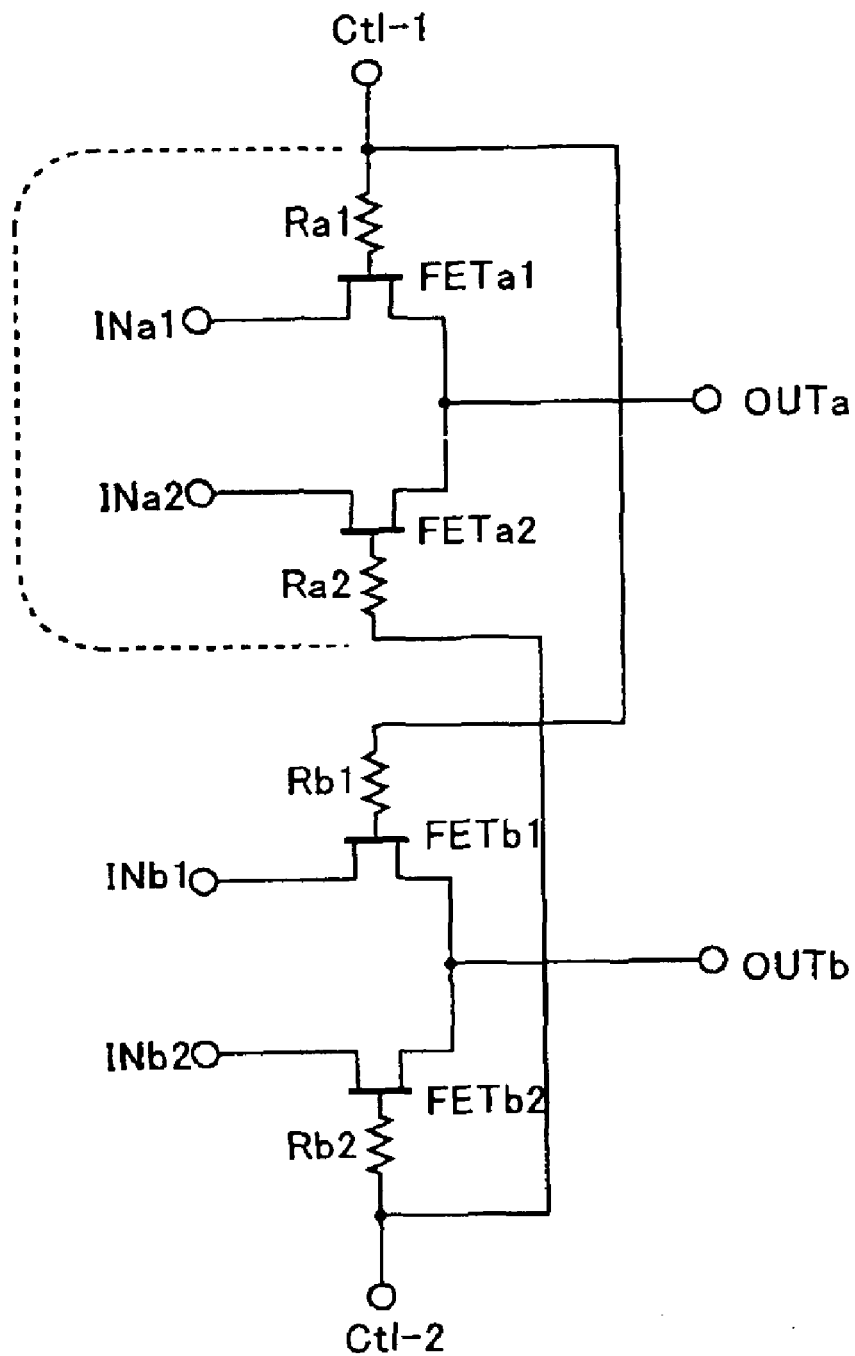
FIG. 2 is a circuit diagram of a semiconductor switching circuit device of a first embodiment of this invention.

FIG. 2 is a circuit diagram of a semiconductor switching circuit device of a first embodiment of this invention. The device has first, second, third and fourth FETs, which are referred as FETa1, FETa2, FETb1 and FETb2, respectively, in FIG. 2. Each of the FETs has a source electrode, a gate electrode and a drain electrode on its channel layer. The device also has first, second, third and fourth input terminal pads which are referred as INa1, INa2, INb1 and INb2 in FIG. 2. The first and second input terminal pads are connected to the source electrodes (or the drain electrodes) of the first and second FET, respectively. The third and fourth input terminal pad are connected to the source electrodes (or the drain electrodes) of the third and fourth FET, respectively. The device also has a first common output terminal pad OUTa connected to the drain electrodes (or the source electrodes) of the first and second FETs, and a second common output terminal pad OUTb connected to the drain electrodes (or the source electrodes) of the third and fourth FETs. The device further has first and second control terminal pads Ctl-1, Ctl-2 connected to the gates of the FETs. Resistors Ra1, Rb1 connect the first control terminal pad to the gates of the first and third FET, respectively. Resistors Ra2, Rb2 connect the second control terminal pad to the gates of the second and fourth FET, respectively. The role of the resistors is to prevent the leaking of high frequency signals through the gate electrodes to the DC voltage applied to the control terminal pads, which are substantially grounded at high frequency. Each of the four FETs is a metal-semiconductor field-effect transistor (MESFET) formed on a GaAs substrate.

Figure 1A:
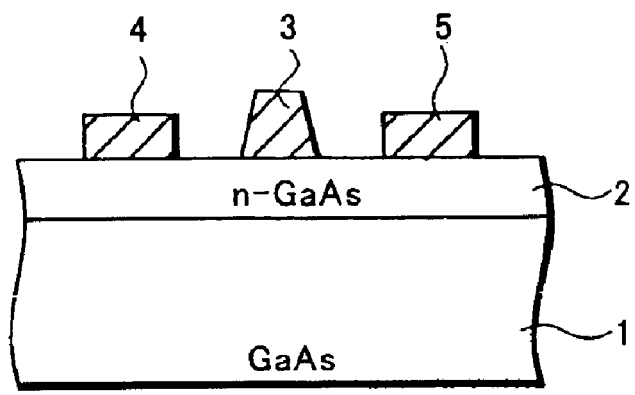
FIG. 1A is a cross-sectional view of a conventional switching device.
Figure 1B:
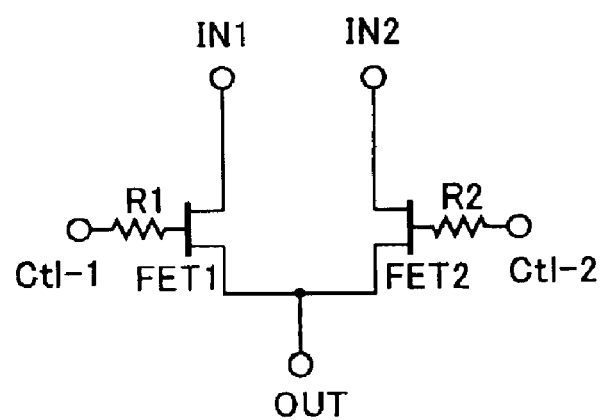
FIG. 1B is a circuit diagram of a conventional SPDT switch.

The circuit of FIG. 2 is composed of two SPDT circuits shown in FIG. 1B, but it differs from a simple combination of the two SPDT circuits in that only two control terminal pads are provided.

The operation of this semiconductor switching circuit device is controlled by the signals applied on the control terminal pads Ctl-1, Ctl-2. These signals are complementary to each other; i.e. one FET of the pair which receives a high level signal turns on and an input signal applied one of the two input terminal pads INa1, INa2 (or INb1, INb2) is transmitted to the common output terminal pad OUTa (or OUTb).

For example, when a high level signal is applied to the control terminal pad Ctl-1 (a low level signal is applied to the control terminal pad Ctl-2), the switching elements FETa1 and FETb1 turn on, and the signals applied to the first input terminal pad INa1 and the third input terminal pad INb1 are transmitted to the output terminal pads OUTa and OUTb, respectively. On the other hand, when a high level signal is applied to the control terminal pad Ctl-2 (a low level signal is applied to the control terminal pad Ctl-1), the switching elements FETa2 and FETb2 turn on, and the signals applied to the second input terminal pad INa2 and the fourth input terminal pad INb2 are transmitted to the output terminal pads OUTa and OUTb, respectively.

When the device alternates signals based on two communication methods, for example, CDMA and GPS, the two balanced signals of the opposite phase of CDMA (or GPS) are applied to the input terminal pads INa1 and INb1, and the two balanced signals of the opposite phase of GPS (or CDMA) are applied to the input terminal pads INa2 and INb2. In this configuration, according to the level of the complementary signals applied to the two control terminal pads Ctl-1, Ctl-2, the device provides a set of balanced signals of either CDMA or GPS from the two common output terminal pads. In other wards, this device operate as a two-switch-element switch.

Figure 3:
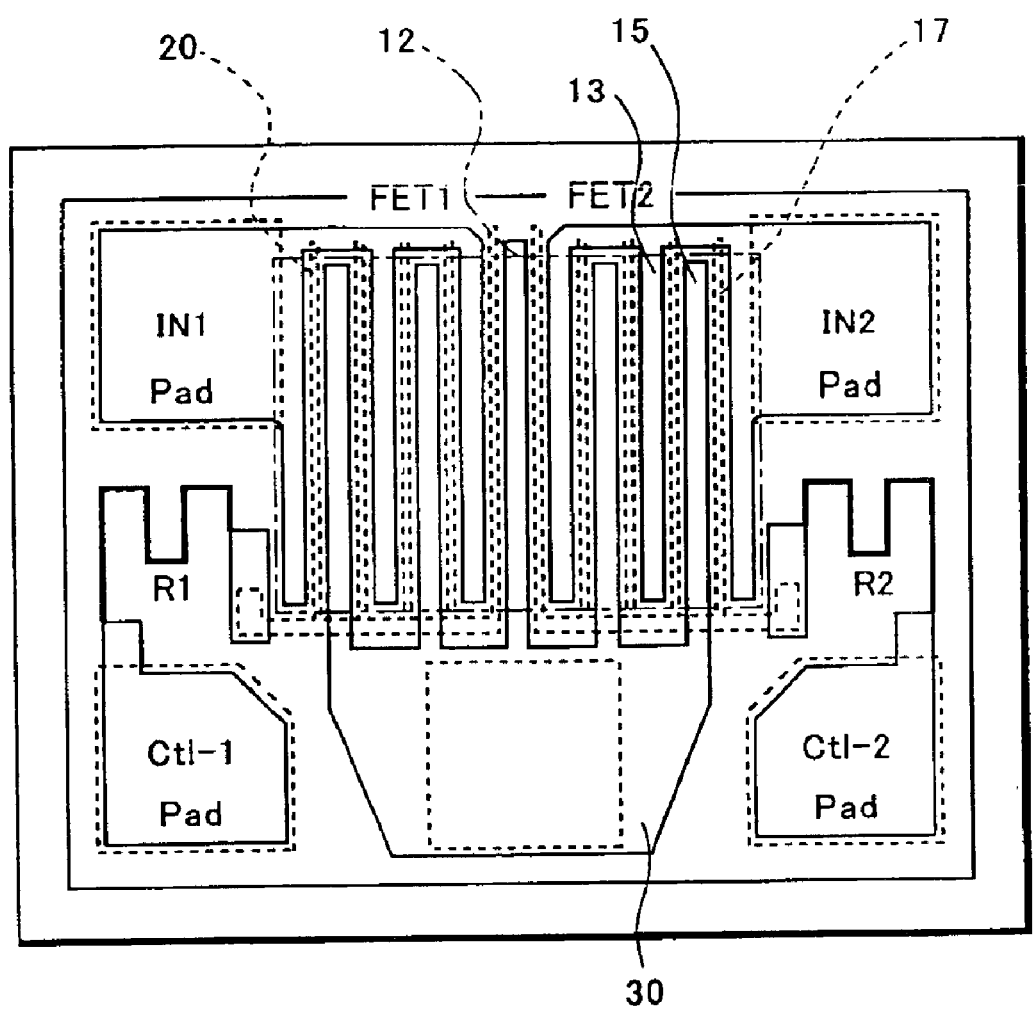
FIG. 3 is a plan view of a device based on the circuit diagram of FIG. 1B.
Figure 4A:
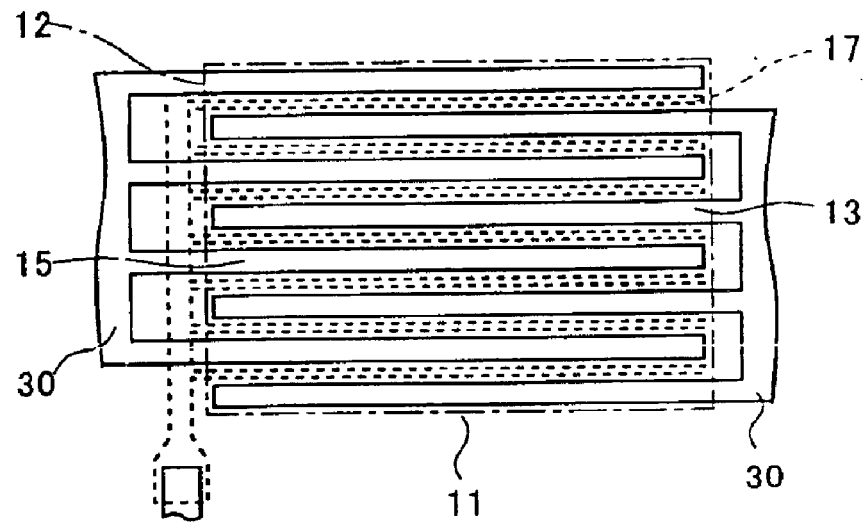
FIG. 4A is an expanded plan view of FIG. 3 showing an FET structure.
Figure 4B:
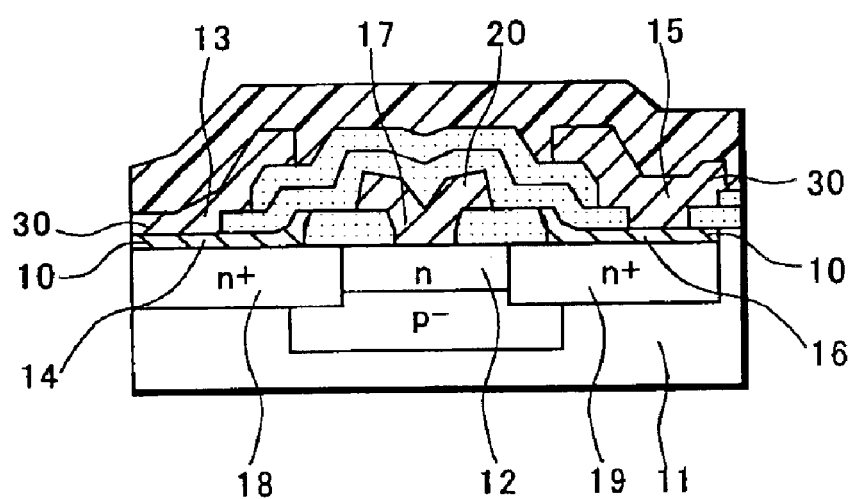
FIG. 4B is a cross-sectional view of the FET of FIG. 4A.

Before describing the physical configuration of the switch device based on the circuit diagram of FIG. 2, a single switch configuration, which forms the basis of the switching device of this invention, will be briefly explained in reference to FIGS. 3, 4A and 4B.

FIG. 3 is an example of a compound semiconductor chip based on the switching circuit shown in FIG. 1B. FET1 and FET2 for the switching operation are formed in the middle of a GaAs substrate with the gate electrode of each FET being connected to its respective resistor (R1 or R2). The dashed lines indicate a second layer of wiring which is formed in the same processing step as the gate electrodes of the FET and includes a gate metal layer (Ti/Pt/Au) 20. A third layer of wiring indicated by the solid lines is for connecting the device elements and forming the terminal pads, and is made of a pad metal layer (Ti/Pt/Au) 30. A first layer contains an ohmic metal layer (AuGe/Ni/Au) 10 making an ohmic contact to the substrate, which forms the source electrode, the drain electrode and the connecting electrodes at both edges of each resistor. In FIG. 3, the first layer is not shown, as it overlaps with the pad metal layer.

FIG. 4A is an expanded plan view of FET1 of the switching device shown in FIG. 3. The area indicated by the dashed line comprising short and long segments is the channel region 12 formed on the substrate 11. The comb-like structure starting from the right is the source electrode 13 (or the drain electrode), which is formed by the third-layer pad metal layer 30 and connected to the input terminal pad IN1. Beneath the source electrode 13 is formed a source electrode 14 (or a drain electrode) which is made of first-layer ohmic metal layer 10. The comb-like structure starting from the left is the drain electrode 15 (or the source electrode), which is formed by the third-layer pad metal layer 30 and connected to the common output terminal pad OUT. Beneath the drain electrode 15 is formed a drain electrode 16 (or a source electrode) which is made of the first-layer ohmic metal layer 10. Between the combs is formed a gate electrode 17 placed on the channel region 12, which is made of a second-layer gate metal 20.

FIG. 4B shows a cross-sectional view of the FET cut perpendicularly to the teeth of the comb. The GaAs substrate 11 has an n-type channel region 12, and two heavily doped regions at both ends of the channel region 12, namely, a source region 18 and a drain region 19. The gate electrode 17, which is made of the gate metal layer 20 as the second metal layer, is formed on the surface of the channel region 12. The first layer drain electrode 14 and the first layer source electrode 16, which are made of the ohmic metal layer 10 as the first metal layer, are formed on the surface of the heavily doped regions. On top of the first-layer source and drain electrodes 14, 16 is formed the third layer source and drain electrode made of the pad metal layer 30 as the third metal layer, namely the third layer drain electrode 15 and the third layer source electrode 13. This layer is responsible for wiring the device elements of the chip.

Figure 5:
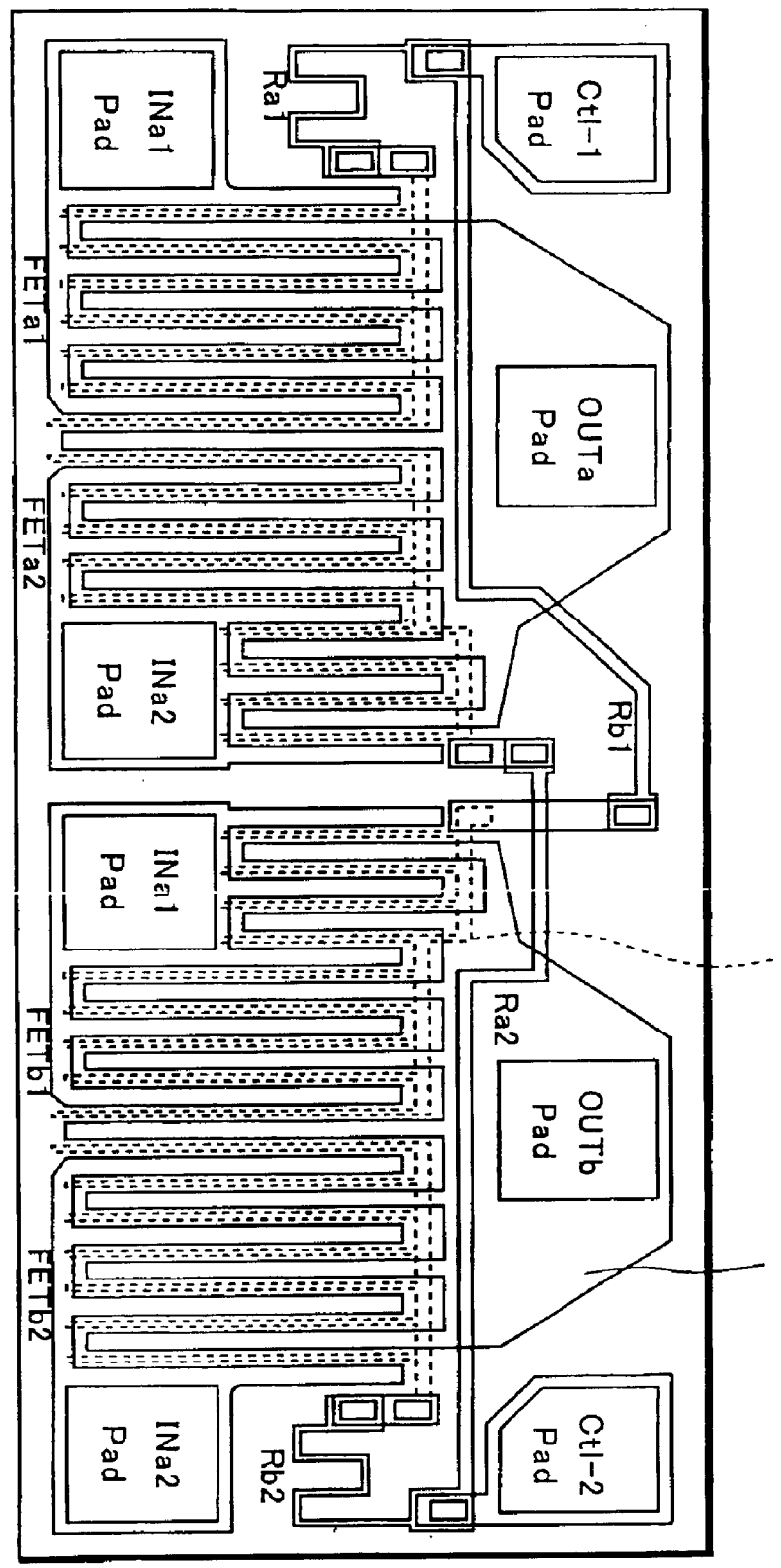
FIG. 5 is a plan view of the semiconductor switching circuit device of FIG. 2.

FIG. 5 shows an example of a compound semiconductor chip based on the switching circuit shown in FIG. 2 of this invention. This is a first embodiment of this invention as a semiconductor switching circuit device, which are used in two other embodiments of this invention as a switching device, as will be described below.

Two pairs of FETs, namely, FETa1/FETa2 and FETb1/FETb2, each of which functions as a switch, are placed on the substrate 11, occupying a majority of its chip surface. Four resistors Ra1, Ra2, Rb1, Rb2 are formed to connect the gate electrodes of the four FETs and their respective control terminal pads, Crt-1, Crt-2. The configuration of the first, second and third metal layers is the same as described in reference to the device shown in FIG. 3.

The significant difference between the configuration shown in FIG. 5 of this invention and the simple combination of two single switches shown in FIG. 3 is that the configuration of FIG. 5 has only two control terminal pads. The control terminal pad Ctl-1 is connected to the gate electrode of FETa1 of the first switch and the gate electrode of FETb1 of the second switch, while the control terminal pad Ctl-2 is connected to the gate electrode FETa2 of the first switch and the gate electrode FETb2 of the second switch.

Resistor Ra1, which connects the control terminal pad Ctl-1 and the gate electrode of FETa1, is placed between the input terminal pad INa1 and the control terminal pad Ctl-1 in a manner similar to the placement of resistors in FIG. 3. However, resistor Rb1, which connects the control terminal pad Ctl-1 and the gate electrode of FETb1, is placed between the edges of the two FETs of the first switch and the edges of the control terminal pad Ctl-1 and the common output terminal pad OUTa.

Similarly, resistor Rb2, which connects the control terminal pad Ctl-2 and the gate electrode of FETb2, is placed between the input terminal pad INb2 and the control terminal pad Ctl-2 in a manner similar to the placement of resistors in FIG. 3. However, resistor Ra2, which connects the control terminal pad Ctl-2 and the gate electrode of FETa2, is placed between the edges of the two FETs of the second switch and the edges of the control terminal pad Ctl-2 and the common output terminal pad OUTb.

This configuration is effective in reducing the chip size because the resistors connecting the control terminal pads and the gates are formed between their terminal pads and the FETs of the device. Furthermore, resistor Ra2 intersects the lead between the gate electrode of FETb1 and resistor Rb1, as shown in FIG. 5. This configuration is also effective in reducing the chip size because there is no need for detouring the resistors to avoid the crossing of the two wiring lines.

Figure 6:
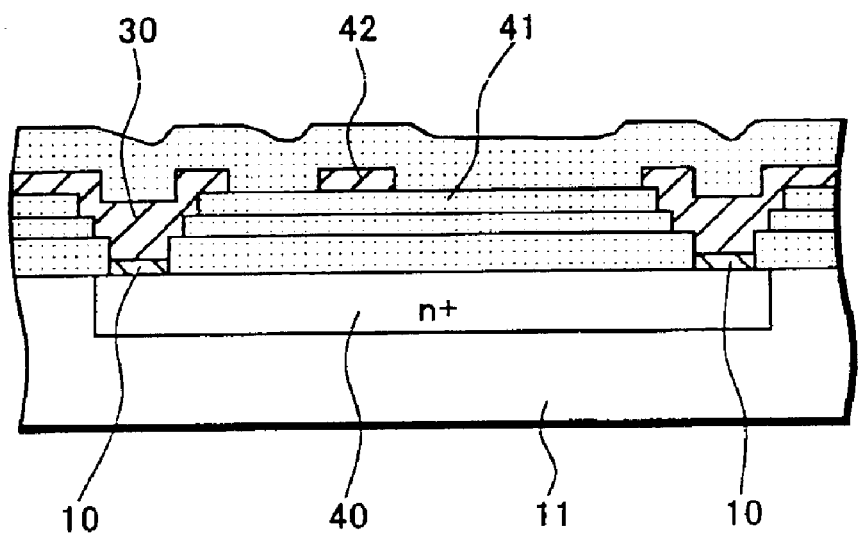
FIG. 6 is a cross-sectional view of a resistor of the semiconductor switching circuit device of the first embodiment.

A multi-layer structure which enables the intersection of the resistor and the lead line is described below in reference to FIG. 6. Resistors Ra1, Rb1, Ra2, Rb2 are made of a n+ high dopant concentration region 40, which is formed together with the formation of the source and drain region by an ion injection process. At both ends of the high dopant concentration region 40 are formed the ohmic metal layers 10, which connect with the third-layer pad metal layer 30 formed at the time of the source and drain electrode formation. Nitride films 41 cover other portions of the high dopant concentration region 40. The lead lines, including the lead 42 connecting the gate electrode of FETb1 and the resistor Rb1, are formed at the time of the formation of the third-layer pad metal layer. Accordingly, there is an insulating layer between the high dopant concentration region 40 and the lead 42, making the intersecting layout possible.

Now, two embodiments of this invention as a switching device, which utilize the semiconductor switching circuit device described above, will be described.

Figure 7A:
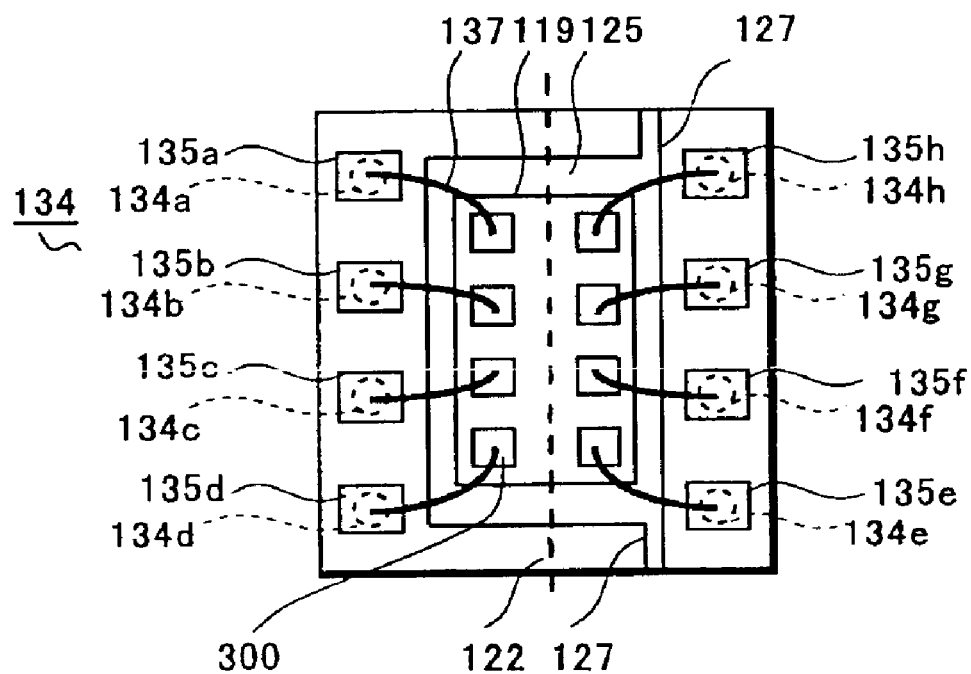
FIG. 7A is a plan view of a switching device of a second embodiment of this invention, and the FIG. 7B is a cross-sectional view of the device of FIG. 7A.
Figure 7B:
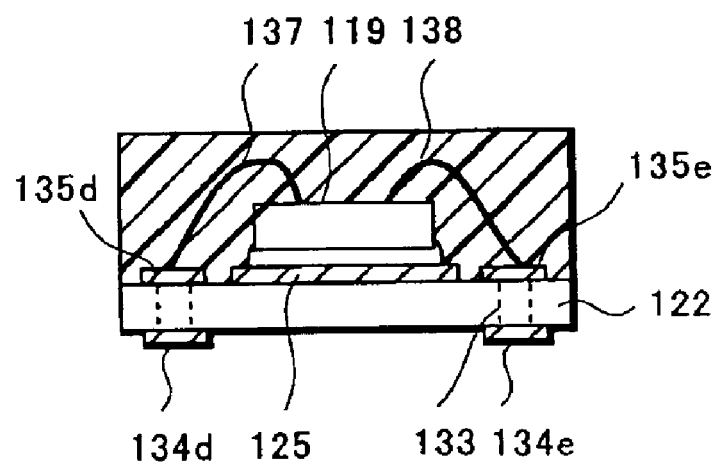

The switching device of the second embodiment is shown in plan view in FIG. 7A, and in cross-sectional view in FIG. 7B. The chip 119 is the semiconductor switching circuit device described above, and placed in the middle of the packaging structure of the switching device. The rectangles 300 on the chip 119 are the terminal pads INa1, INa2, INb1, INb2, OUTa, OUTb, Ctl-1, Ctl-2, described above. Each of the terminal pads has a corresponding external electrode 134 placed near it, which is formed on the back side of an insulating board on which the chip 119 is mounted. A wire 137 connects the terminal pad 300 and the lead 135, which is connected to the external electrode 134 via a through hole 133.

The eight external electrodes 134a–134h are placed substantially symmetrically with respect to the center line of the insulating board 122, as shown in FIG. 7A. Four external electrodes 134a–134d are placed along one side of the insulating board 122 for the input terminal pads INa1, INa2, INb1, INb2, disposed in this order. Other four external electrodes 135e–135h are placed along other side of the insulating board 122 for the terminal pads Ctl-1, OUTa, OUTb, Ctl-2, disposed in this order. The top flat surface and four sides of the package are made of a resin, and its bottom surface is the back side of the insulating board 122.

The thickness of the resin layer 138 sealing the chip 119 mounted on the insulating board 122 is approximately 300 $\mu$m. The chip itself is about 130 $\mu$m thick. The island portion 125 and the leads 135a–135h are formed away from the edge of the insulating board 122, and only the connecting portion 127 of the leads is exposed on the side of the package.

Because the external electrodes are substantially symmetrically placed on the back side of the insulating board 122, it is difficult to determine the polarity of the external electrodes. Accordingly, it is desirable that a marking to indicate the polarity be formed on the top surface of the resin layer 138. Such markings include a dent or a print mark on the top surface of the resin layer 138.

Figure 8:
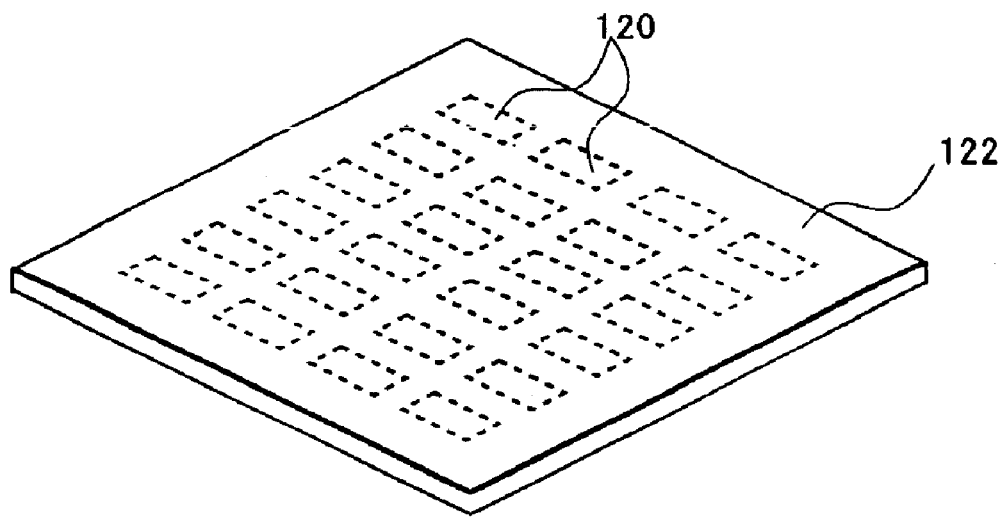
FIG. 8 is a perspective view of an insulating board used in a manufacturing process of the switching device of the second embodiment.

One of the manufacturing methods that may be used to make the device of the second embodiment will be described in reference to FIGS. 8–10.

The first step (FIGS. 8, 9A and 9B):

First, a large insulating board 122 is prepared. This insulating board 122 has a plurality of package regions 120, for example a hundred regions, each of which corresponds to one compound semiconductor chip described above. The insulating board 122 is made of an insulating material including ceramics, glass epoxies and their composites. The thickness of the insulating board 122 is 180–250 $\mu$m, which is enough to produce the mechanical strength required for the manufacturing process.

Figure 9A:
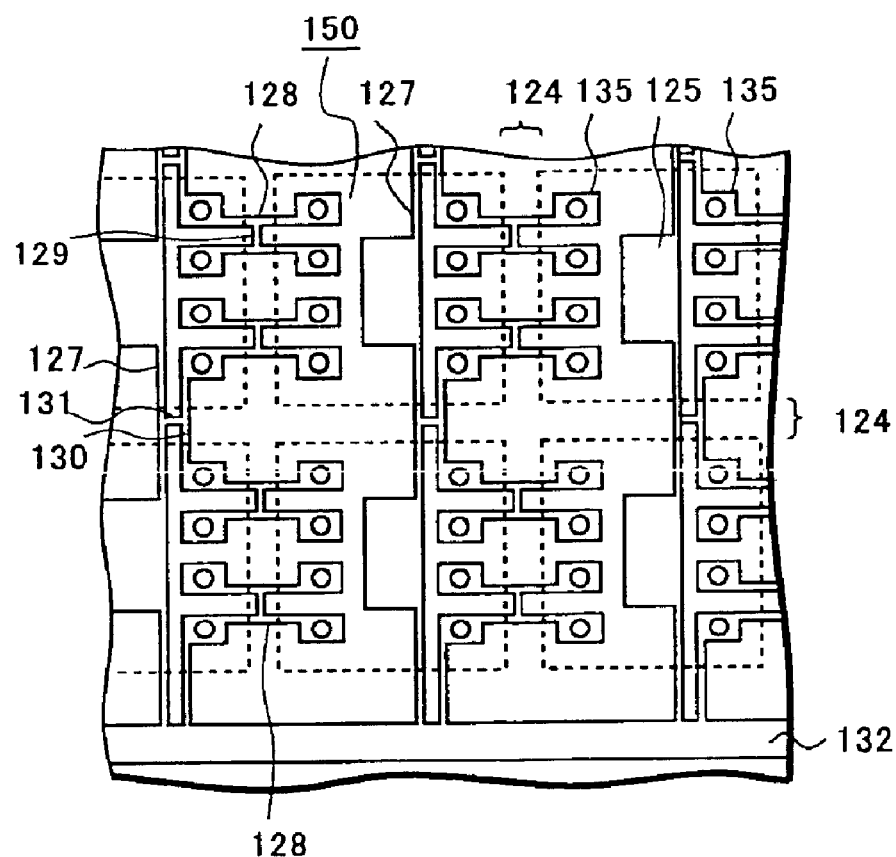
FIG. 9A is a top view of the insulating board of FIG. 8 having a conductor pattern thereon.
Figure 9B:
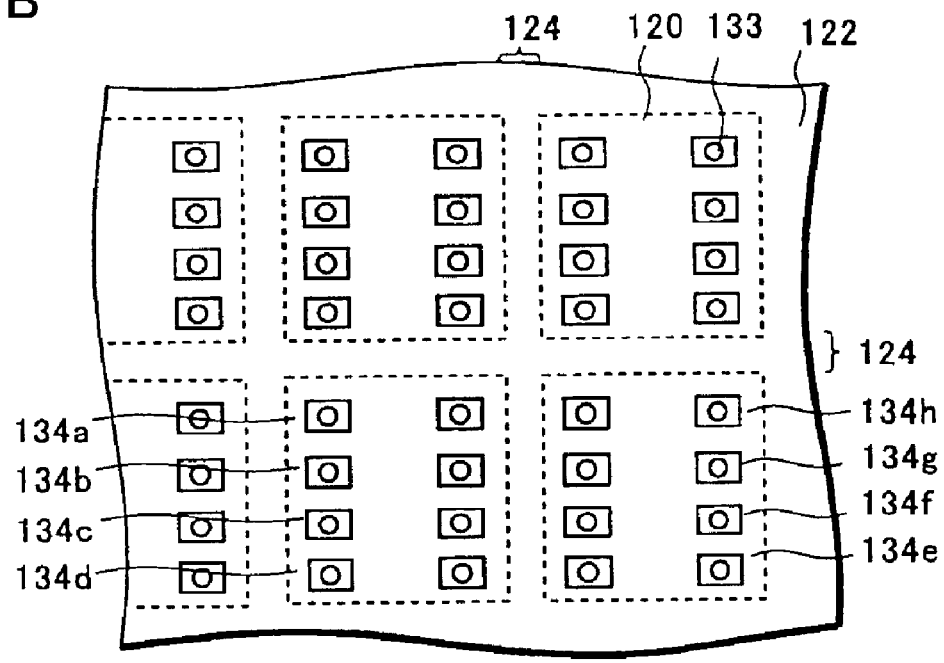
FIG. 9B is a bottom view of the insulating board.
Figure 10A:
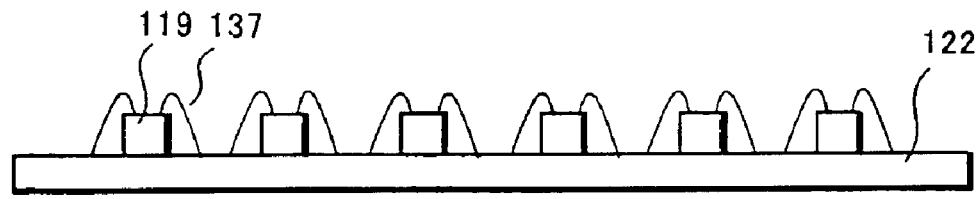
FIGS. 10A–10D show steps of the manufacturing process of the switching device of the second embodiment.
Figure 10B:
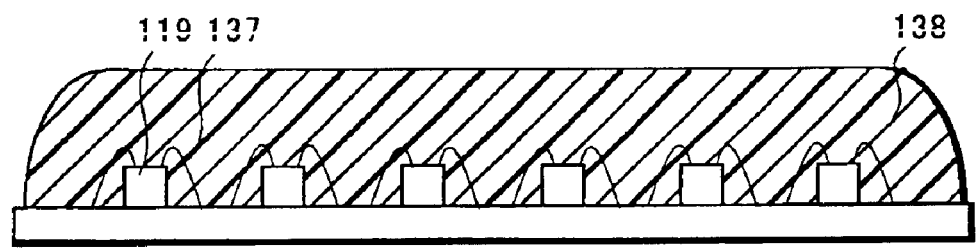
Figure 10C:
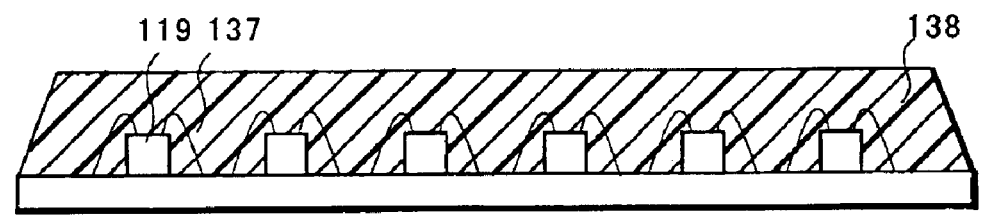
Figure 10D:
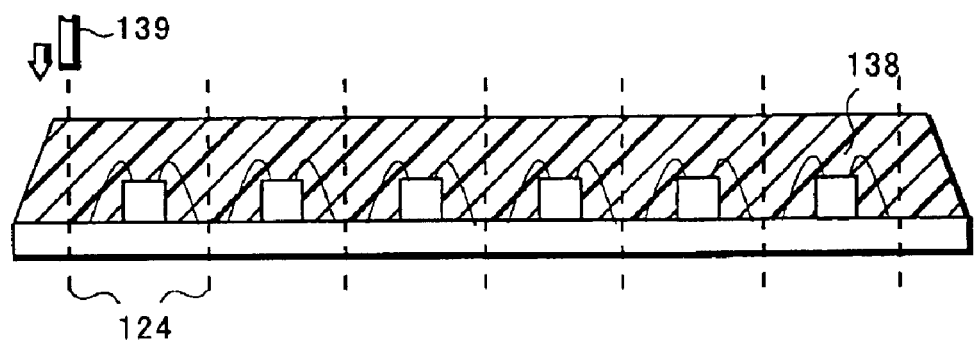

FIG. 9A is a plan view showing the conductor pattern 150 formed on the surface of the insulating board 122, and FIG. 9B is a plan view showing the conductor pattern formed on the back side of the insulating board 122.

On the surface of each package region 120 of the insulating board 122, a conductor pattern 150 is formed by metal paste printing using tungsten or the like and by electrolytic gold plating. The conductor pattern 150 is formed first by applying the metal paste using a printing technique followed by calcination, and then by forming a gold layer on the metal paste using electrolytic gold plating.

The package region 120 encircled by the broken line in FIG. 9B has a rectangular shape. The package regions 120 are disposed in lateral and longitudinal directions with an interval space of about 100 $\mu$m. This interval space will become a dicing line 124 later in the process. In each package region 120, the conductor pattern 150 forms an island portion 125 and a lead portion 135, which are identical among the package regions 120. The island portion 125 is for the mounting of the compound semiconductor chip 119, and the terminal pads of the compound semiconductor chip 119 are connected by a wire to the lead 135.

A first connecting part 127 extends to both sides from the island portion 125. The width of the connecting part 127 is narrower than the width of the island portion 125, and is about, for example, 0.5 mm. The first connecting part 127 extends beyond the dicing line 124 reaching the island portion 125 of the adjacent package region 120. The first connecting part 127 connects with the common connecting part 132 that surrounds the package regions 120.

Furthermore, a second connecting part 128 extends from each of the lead portions 135 in the direction perpendicular to the connecting part 127, and reaches to the lead portion 135 of the adjacent package region 120 beyond the dicing line 124. Also, two connecting parts 128 adjacent to each other are connected by a third connecting part 129 within the dicing line 124.

From the lead portions 135 located next to the boundary of the package region 120, a fourth connecting part 130 extends in the direction parallel to the first connecting part 127, and reaches to the lead portion 135 of the adjacent package region 120 beyond the dicing line 124. The fourth connecting part 130 also connects with the common connecting part 132 that surrounds the package regions 120. The fourth connecting part 130 is also connected to the first connecting part 127 by a fifth connecting part 131 within the dicing line 124.

The island portion 125 and the lead portion 135 in the package region 120 are electrically connected by means of the first, second, third, fourth and fifth connecting parts 127, 128, 129, 130, 131.

As shown in FIG. 9B, through holes 133 are formed for each package region 120 in the insulating board 122. The through hole 133 is filled with conductor materials such as tungsten. The external electrodes 134a, 134b, 134c, 134d, 134e, 134f, 134g, 134h corresponding to the through holes 133 are formed on the back side of the insulating board 122. These external electrodes 134a, 134b, 134c, 134d, 134e, 134f, 134g, 134h are located about 50–100 $\mu$m from the edge of the package region 120. They are electrically connected to the common connecting part 132 through the through holes 133.

Through the electrolytic plating where the conductor pattern 150 is used as one electrode, the gold plating layer is formed on the conductor pattern 150. It is possible to use an electric plating method, because each conductor pattern 150 is electrically connected by the common connecting part 132.

The second step (FIG. 10A):

The compound semiconductor chip 119 is die-bonded and wire-bonded to each of the package region 120 on the insulating board 122 having the gold plating layer. The compound semiconductor chip 119 is mounted on the island portion 125 with an adhesive such as Ag paste or the like. The terminal pads of the compound semiconductor chip 119 and lead portions 135a, 135b, 135c, 135d, 135e, 135f, 135g, 135h are connected by the wire 137.

The third step (FIG. 10B):

From a dispenser (not shown in the figure), which is transported above the insulating board 122, a predetermined amount of epoxy liquid resin (potting) is deposited on the compound semiconductor chips 119, resulting in the formation of the resin layer 138. When there are, for example, 100 compound semiconductor chips 119 on one insulating board 122, all 100 compound semiconductor chips should be covered altogether. The liquid resin used was CV576AN from Matsushita Denko K. K. The resin has a relatively high viscosity and a surface tension so that the resin layer 138 has a curved surface.

The fourth step (FIG. 10C):

The resin layer 138 undergoes this step to make its curved surface flat. There are two methods to achieve this step. The first method is to press the resin with a flat surface before the resin hardens. The second method is to polish the curved surface after the resin layer 138 hardens by curing at 200–300° C. for a few hours. In the second method, a grinding device is used to grind the surface of the resin layer 138 so that the resin layer 138 has a uniform height from the insulating board 122. The flat surface should extend to cover the compound semiconductor chip 119 located at the edge of the insulating board 122 so that a properly packaged device is made from this portion of the insulating board 122 when the compound semiconductor chips 119 are separated from each other. A relatively thick blade is appropriate for this step.

The fifth step (FIG. 10D):

In this step, the individual compound switching devices are separated. Using a dicing device, the resin layer 138 and the insulating board 122 are cut by a dicing blade 139 along the dicing line 124 so that the compound semiconductor switching circuit device are separated for each of the package regions 120. A blue sheet (for example, UV Sheet from Rintech K. K.) is attached on the back side of the insulating board 122, and the cutting is performed so that the dicing blade reaches the bottom side of the blue sheet. During this process, the dicing device automatically recognizes a marking on the surface of the insulating board 122, and uses this marking for determining the dicing position.

Figure 11:
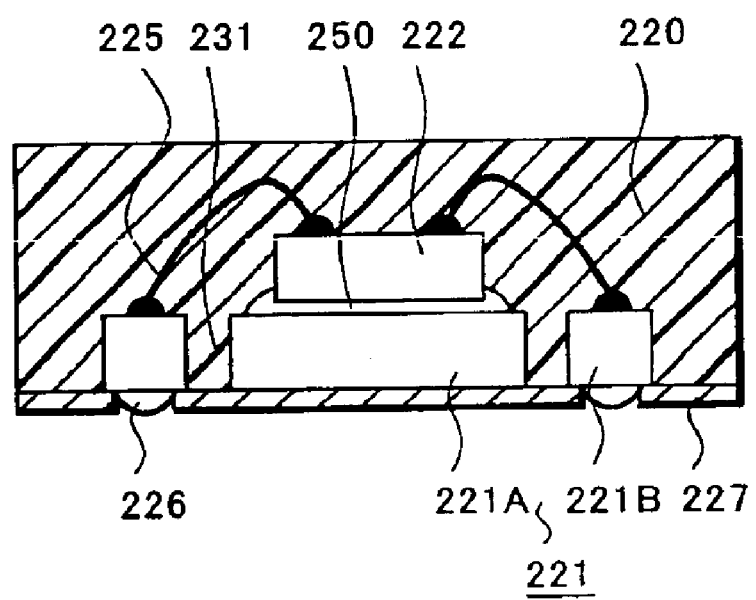
FIG. 11 is a cross-sectional view of a switching device of a third embodiment of this invention.

The switching device of a third embodiment of this invention is shown in FIG. 11, which is a cross-sectional view of the switching device having a semiconductor chip similar to the one used in the second embodiment. The plan view of this package is similar to that of the second embodiment shown in FIG. 7A, so the plan view and related descriptions are omitted.

In the third embodiment, the whole conductor pattern 221 and the chip 222 are embedded in an insulating resin film 220, which also serves as a body supporting the device. The insulating resin film 220 completely covers the chip 222 and the multiple conductor pattern 221, and fills the separation gap 231 between the leads 221A, 221B of the conductor pattern 221. The island portion 221A of the conductor pattern 221 provides a base on which the chip 222 is mounted. The side wall of the leads 221A, 221B has a curved surface for strengthening the bonding between the resin film 220 and the leads 221A, 221B (The curved surface is not shown in FIG. 11). Accordingly, the conductor pattern 221 and the chip 222 are firmly supported by the resin film 220. A thermosetting resin including an epoxy resin may be used for transfer molding, and a thermoplastic resin including a polyimide resin and a polyphenylene sulfide resin may be used for injection molding.

The thickness of the insulating resin film 220 is set so that the top of the bonding wire 225 for the chip 222 is about 50 μm deep from the top surface of the resin film 220. However, the thickness of the resin film 220 may vary depending on the required strength of the resin film 220.

The bonding wire 225 connects the eight terminal pads of the chip 222 and the leads 221A corresponding to the terminal pads. During one wire bonding processing step, all the terminal pads INa1, INa2, INb1, INb2, OUTa, OUTb, Ctl-1, Ctl-2 are wire-bonded to the respective lead 221B by ball bonding or wedge bonding with ultrasonic waves. The leads 221B have a configuration similar to that of leads 135a–135h of the second embodiment. The chip 222 is fixed on the island portion 221A with an insulating adhesive 250. As stated above, the chip 222 is the same compound semiconductor switching circuit formed on a GaAs substrate as the one used in the second embodiment. It is noted that the back side of the GaAs substrate forms a semi-insulator.

The eight external electrodes 226 of this embodiment have a configuration similar to the external electrodes 134a–134h of the second embodiment with respect to their location on the back side of the packaging. The external electrodes 226 is made of a solder metal, which is introduced into holes of a photoresist layer 227 formed on the back side corresponding to the locations for the external electrode formation. Accordingly, the back side of the packaging is covered by the photoresist layer 227 except the external electrodes 226. Markings for the polarity of the external electrodes are formed in a similar manner as in the second embodiment.

One of the manufacturing methods which may be used to make the third embodiment of this invention will be explained in detail with reference to FIGS. 12–19B:

The first step (FIGS. 12A, 12B, 13, 14A and 14B):

In this step, a metal sheet 230 is prepared. On this metal sheet 230, a separating ditch 231 with a depth thinner than the thickness of the metal sheet 230 is formed by etching, except the region for the conductor pattern 221.

Figure 12A:
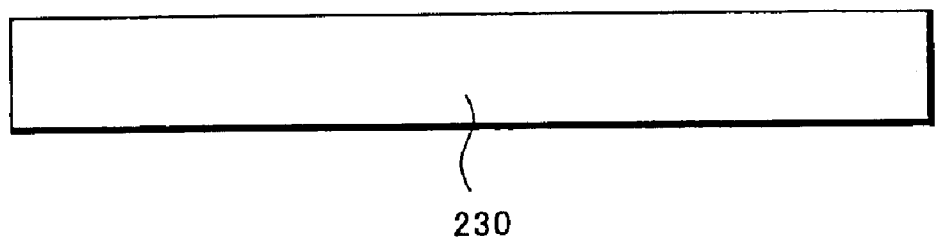
FIGS. 12A and 12B are plan views of a metal sheet used in a manufacturing process of the switching device of the embodiment of this invention.

As shown in FIG. 12A, first a starting metal sheet 230 is provided. The material for the metal sheet 230 is selected based on the adhesive, bonding, and plating properties of the solder metal. The material for the metal sheet 230 is preferably Cu, but includes Al and alloys made of Cu, Al, Fe, Ni and the like.

The preferred thickness of the metal sheet 230 for this step is about 10–300 μm. In this embodiment, a copper sheet of 70 μm thickness was used. However, any thickness outside of this range is acceptable as long as a separating ditch 231 can be formed. Also, the metal sheet 230 may be supplied as a roll with a width of 45 mm, or may be cut into strips and transferred to the manufacturing process.

Figure 12B:
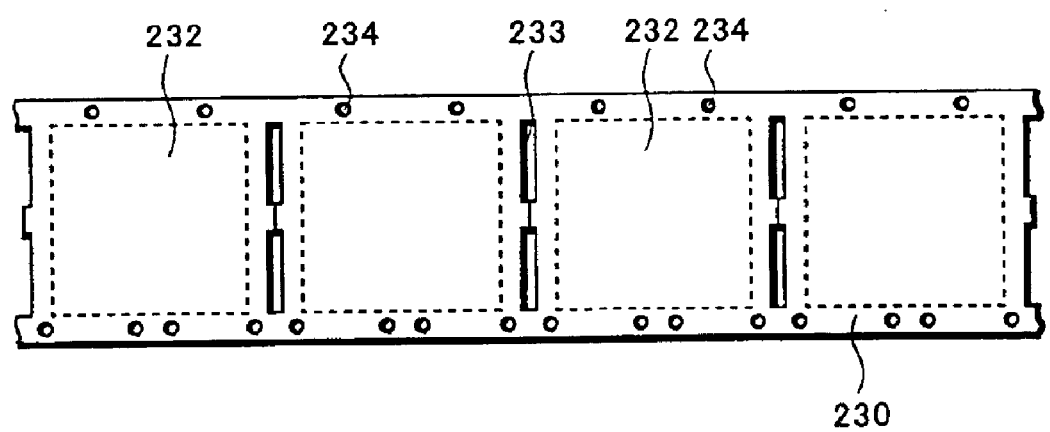
Figure 13:
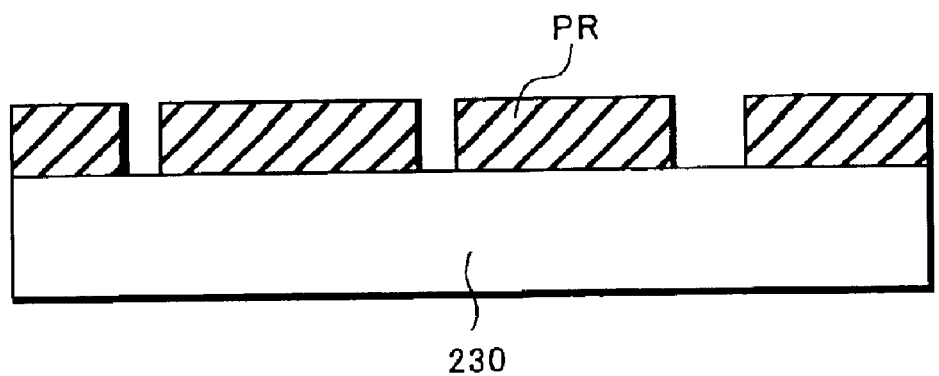
FIG. 13 is a schematic cross-sectional view of the metal sheet having a patterned resist layer thereon.

As shown in FIG. 12B, blocks 232 corresponding to the package regions are formed on the metal sheet 230 at a predetermined interval. A slit 233 that absorbs the stress of the metal sheet 230 generated by thermal processing during the molding process is formed between the blocks 232. Also, index holes 234 for positioning are formed with a predetermined interval at the both sides of the strip of metal sheet 230.

Figure 14A:
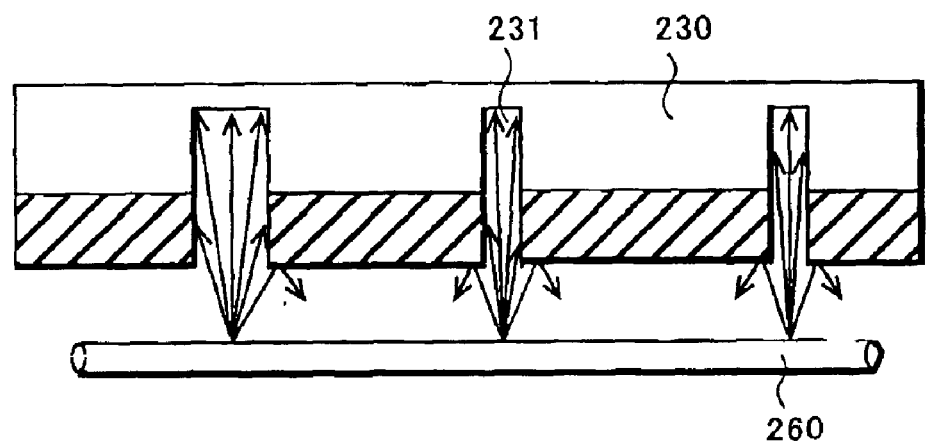
FIG. 14A is a schematic cross-sectional view of the metal sheet and the resist layer of FIG. 13 under an etching process.
Figure 14B:
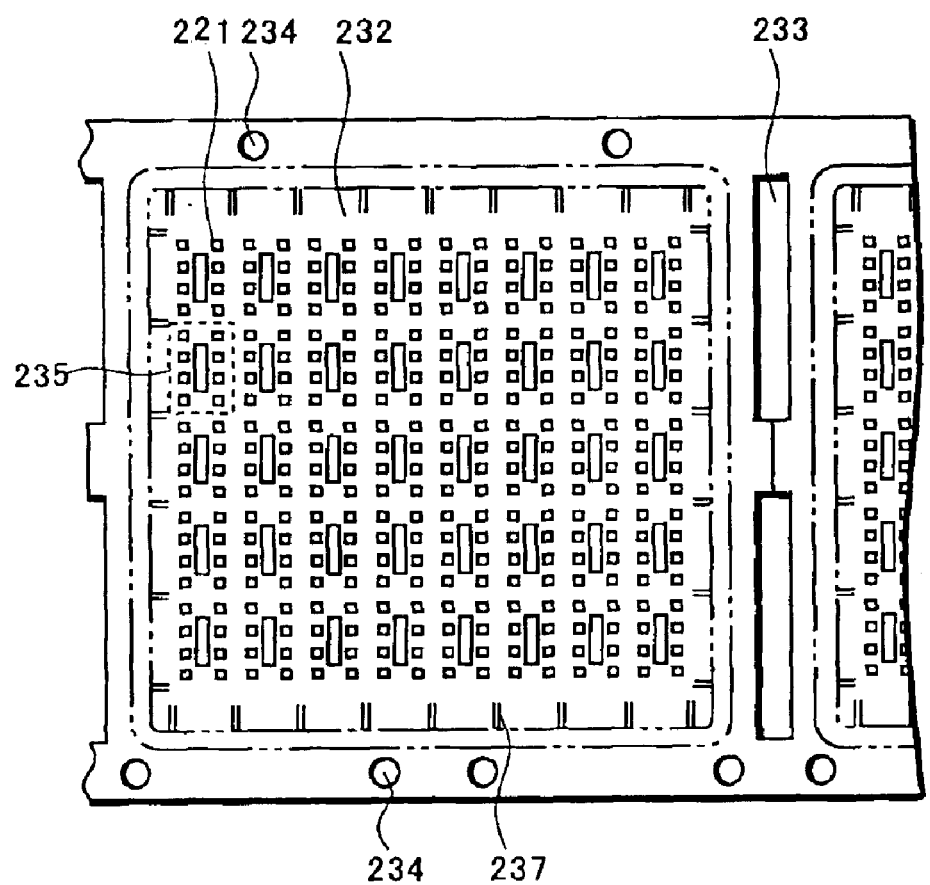
FIG. 14B is a plan view of the metal sheet of FIG. 14A after etching.

The conductor pattern 221 is then formed on the metal sheet 230 as shown in FIGS. 14A and 14B. The photoresist layer PR, which protects the metal from etching, is formed on the metal sheet 230. A pattern is formed on the photoresist layer PR so that the metal sheet 230 is exposed except the regions for the conductor pattern 221. As shown in FIG. 14A, the etching is performed on the metal sheet 230 using the photoresist layer PR.

During this step, in order to make the depth of the separating ditches 231 uniform and accurate, the etching liquid is sprayed upwards from the supply pipe 260, which is provided under the metal sheet 230, to the openings corresponding to the separating ditches 231 as shown in FIG. 14A. Accordingly, only the portions of the metal sheet 230 corresponding to the separating ditches 231 are etched. The etching liquid does not stay in the separating ditch 231 and immediately flows out of the ditches 231. Therefore, the depths of the separating ditches 231 can be controlled by the duration of the spraying, and it is therefore possible to form the uniform and accurate separating ditches 231. Solutions of iron (III) chloride or copper (II) chloride may be used as the etching liquid.

The conductor pattern 221 is shown in FIG. 14B. This figure shows a magnified view of one of the blocks 232 shown in FIG. 12B. The portion encircled by the broken line is one package region 235 having the conductor pattern 221. In one block 232, a plurality of the package regions 235 are disposed in a matrix configuration. Each of the package regions 235 has the same conductor pattern 221.

Figure 15A:
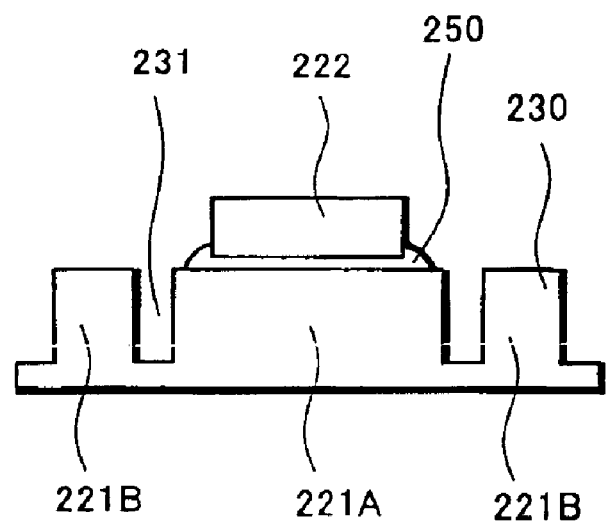
FIG. 15A is a cross-sectional view and FIG. 15B is a plan view of the metal sheet on which a chip is mounted.
Figure 15B:
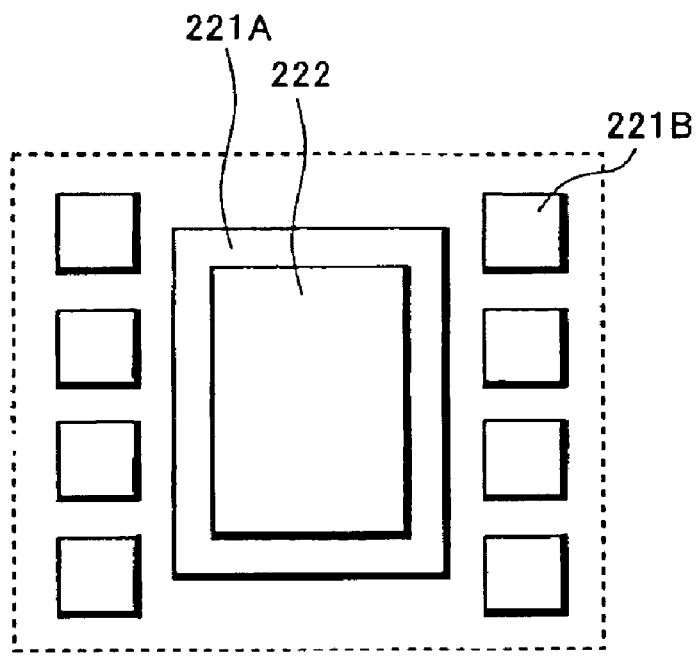
Figure 16A:
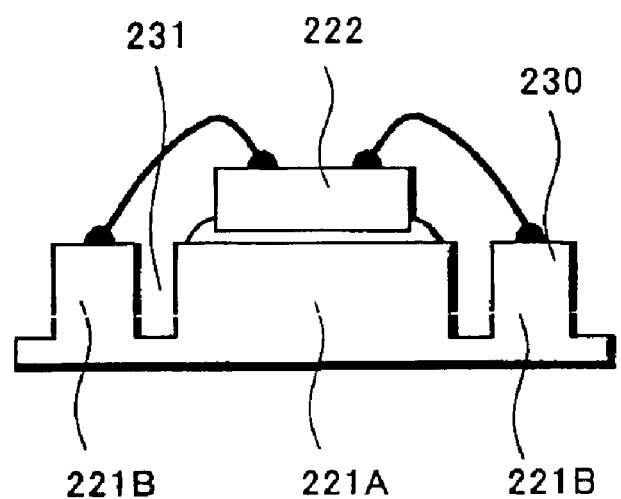
FIG. 16A is a cross-sectional view and FIG. 16B is a plan view of the metal sheet after wire bonding.
Figure 16B:
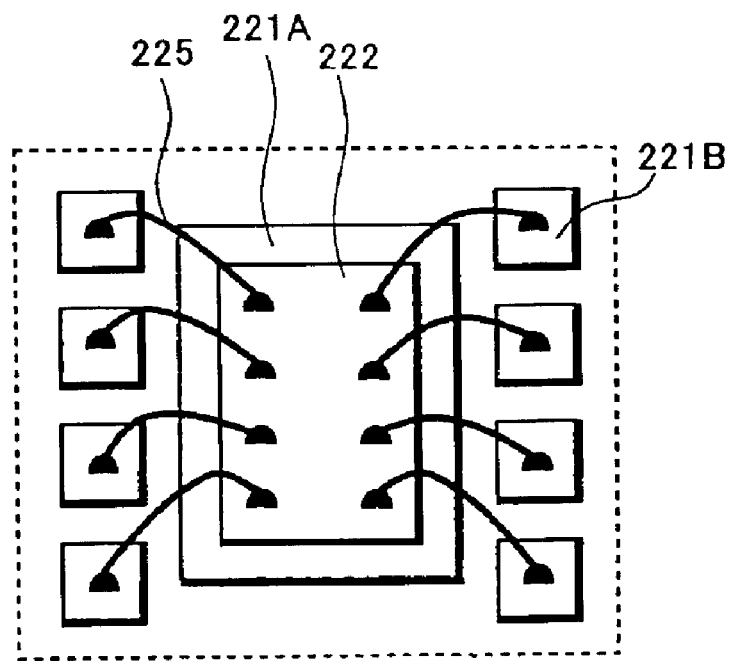

The second step:

As shown in FIGS. 15A and 15B, the semiconductor chip 222 is then mounted on the island portion 221A of the conductor pattern 221 by die-bonding. A cramper (not shown in the figure) holds the metal sheet 230 and a heat block (not shown in the figure) together. Then, as shown in FIGS. 16A and 16B, each pad and its corresponding lead 221B are wire-bonded using a bonding wire 225 by either ball bonding with thermal pressing or wedge bonding with ultrasound waves. Only one cramping procedure is necessary for wire-bonding all the chips 222 on the metal sheet 230 or the block 232. By a comparison, conventional methods need individual cramping for each chip 222.

Figure 17A:
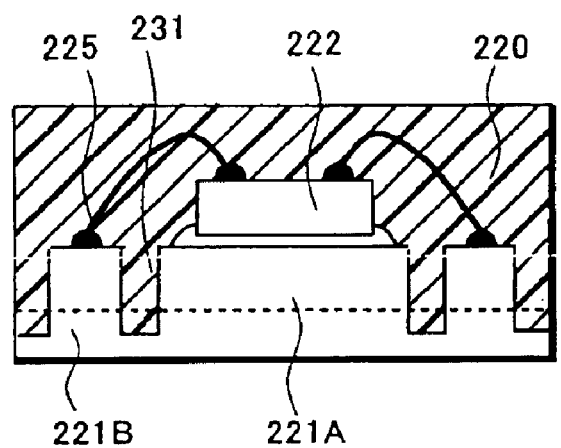
FIG. 17A is a cross-sectional view and FIG. 17B is a plan view of the metal sheet covered with resin film.
Figure 17B:
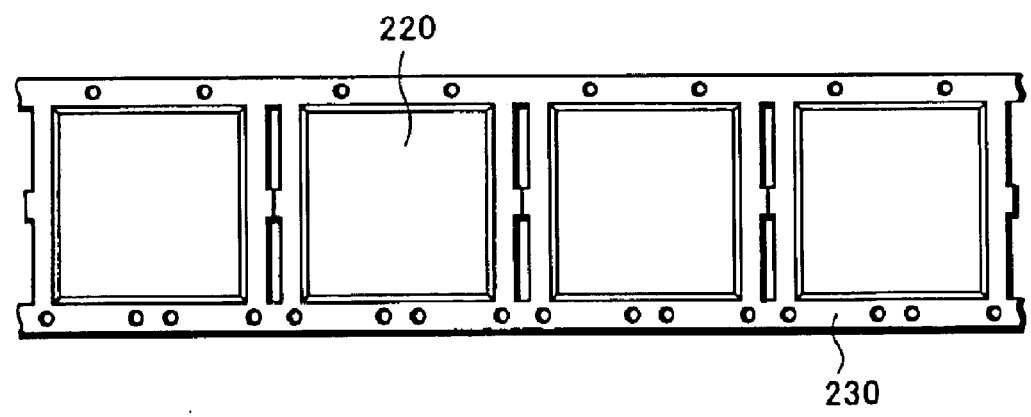

The third step:

As shown in FIG. 17A, an insulating resin is applied to the metal sheet 230 through transfer molding or injection molding to form the resin film 220, which completely covers the semiconductor chip 222 and the conductor pattern 221 and fills the separating ditch 231 between the conductor patterns 221. The resin film 220 is firmly connected to the curved surface of the side wall of the conductor pattern 221, and supports the conductor pattern 221. This resin film 220 is formed for each of the blocks 232 on the metal sheet 230 as shown in FIG. 17B.

After the formation of the resin film 220, the layer is annealed to improve the surface flatness. Especially when the insulating resin is applied on a relatively large area, the metal sheet may slightly bend due to the difference in thermal expansion coefficient between the metal sheet 230 and the insulating resin and due to the difference in the contraction rate upon cooling after the reflow. In such a case, the surface flatness may be improved by the annealing.

The fourth step:

This step involves chemical or physical removal of the surface of the back side of the metal sheet 230. Polishing, grinding, etching or laser zapping may be used for this step.

In this embodiment, the entire back surface of the metal sheet 230 is removed by about 30 $\mu$m using a grinding device so that the insulating resin is exposed from the separating ditch 231. The cutting depth is shown by the broken line in FIG. 17A. As a result, the conductor patterns 221, which have a thickness of about 40 $\mu$m, are isolated from each other. It is possible to perform wet etching on the entire back surface of the metal sheet 230 followed by either polishing or grinding down to the cutting depth. It is also possible to perform only the wet etching to remove the metal and the resin. In any case, the conductor patterns 221 emerge on the back side of the resin film 220.

Then, each package region 235 receives a treatment to acquire the configuration shown in FIG. 11. That is, a conductor materials such as solder is applied to the exposed conductor pattern 221 as an external electrode 226.

At this stage, each block 232 is no longer connected to the frame of the metal sheet 230. Only the insulating resin holds the blocks 232 and the metal frame together. Thus, it is possible to mechanically peel off the block 232 from the metal frame of the metal sheet 230 without using cutting mold.

Figure 18A:
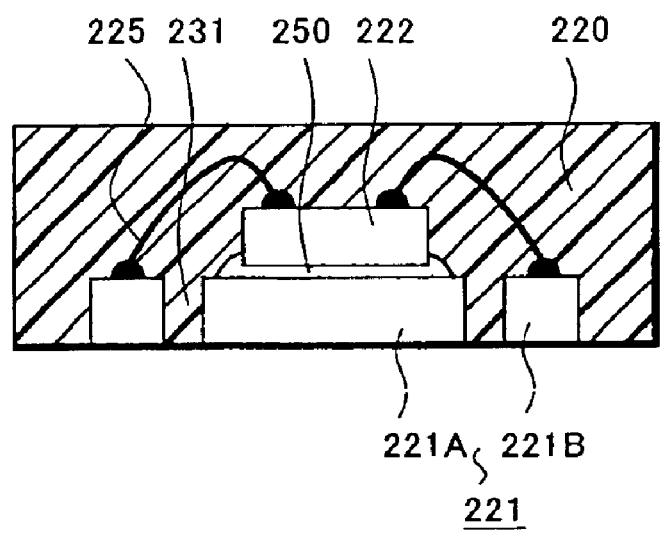
FIG. 18A is a cross-sectional view and FIG. 18B is a plan view of a block peeled from the metal sheet.
Figure 18B:
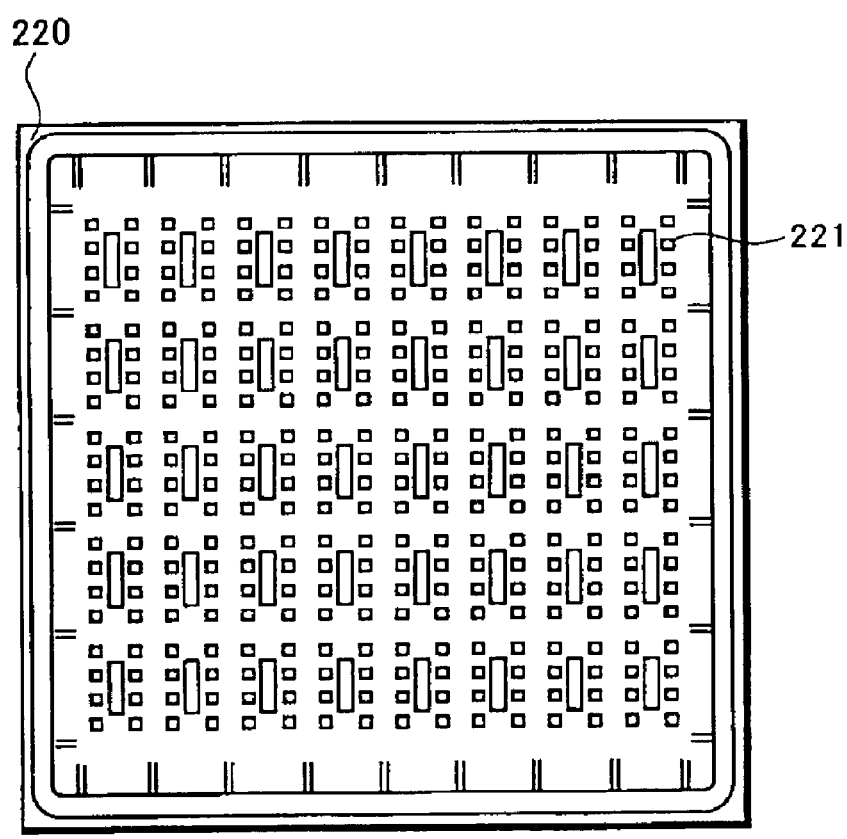

On the back side of each block 232, the conductor patterns 221 are exposed as shown in FIGS. 18A and 18B. The package regions 235 are disposed in the same matrix configuration as they were originally formed on the front side of the metal sheet 230. A testing probe is applied to the external electrode 226 exposed from the resin film 220, and measures the characteristic parameters of individual semiconductor chips 222 of the package region 235 for the detection of defective products. A magnetic ink marking is applied on the defective products. This testing does not include finding the test side of the device or the location of the electrodes. Therefore, the testing period can be considerably reduced.

Figure 19A:
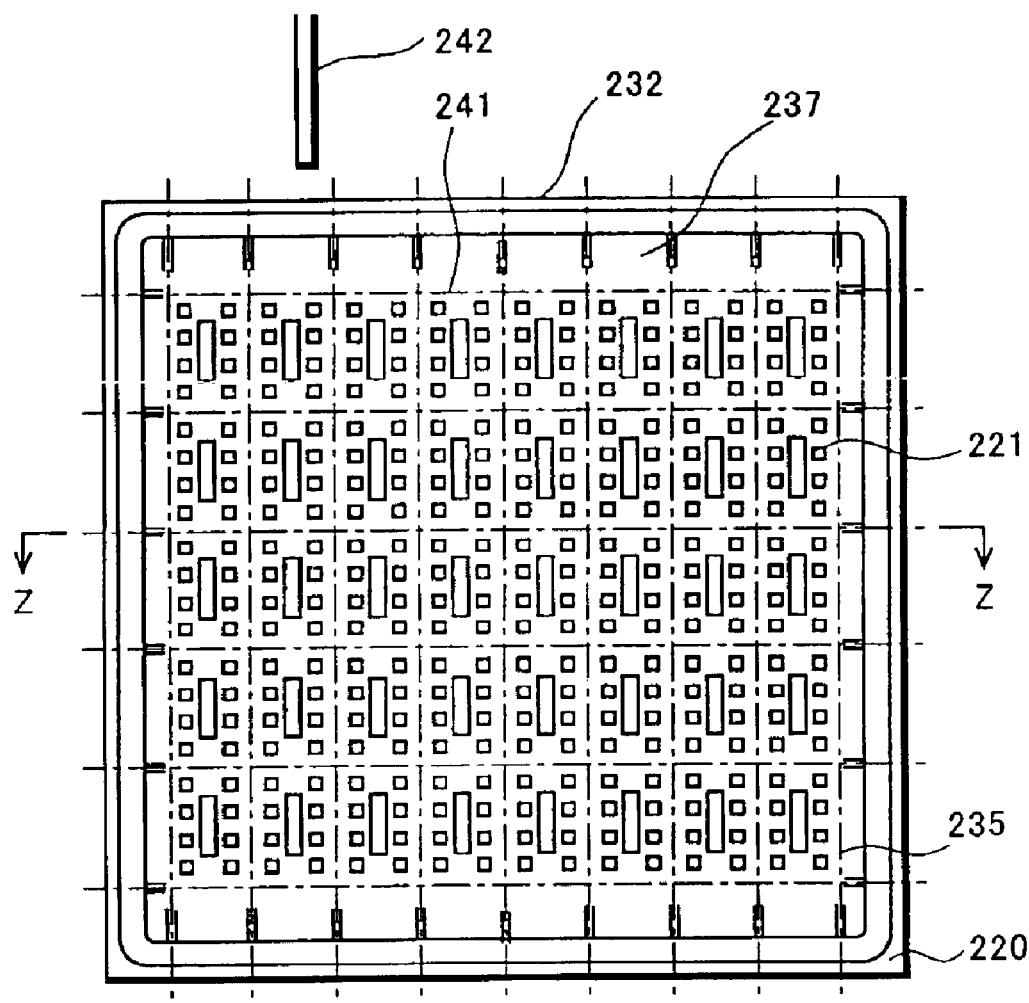
FIG. 19A is a plan view and FIG. 19B is a cross-sectional view of the block of FIG. 18B showing the dicing scheme.
Figure 19B:
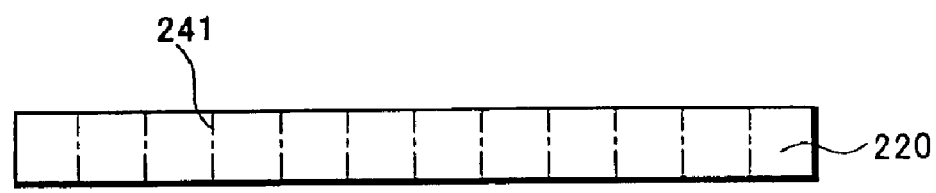

The fifth step:

In this step, as shown in FIGS. 19A and 19B, the block 232 is attached to a table of a dicing device by vacuum suction. Although FIG. 19A shows the conductor pattern 221, it is covered by photoresist layer PR or solder metal at this step. A dicing blade 242, then cuts along the dicing line 241 between the package regions 235, and finally separates individual devices 223.

The advantage of this manufacturing method is that the metal sheet 230, which becomes the conductor pattern 221, serves as a supporting body until the insulating resin is applied. Because the metal sheet 230 is a necessary ingredient for the device construction as the conductor pattern 221, this configuration eliminates a need for a support, such as the insulating board 122 of the second embodiment.

Also, since the separating ditch 231 is shallower than the thickness of the metal sheet 230, the metal sheet 230 is not separated into individual conductor patterns 221. Thus, it is possible to handle many conductor patterns 221 altogether as one sheet, resulting in much easier handling of the device intermediates during the manufacturing of the device of this invention.

Figure 20:
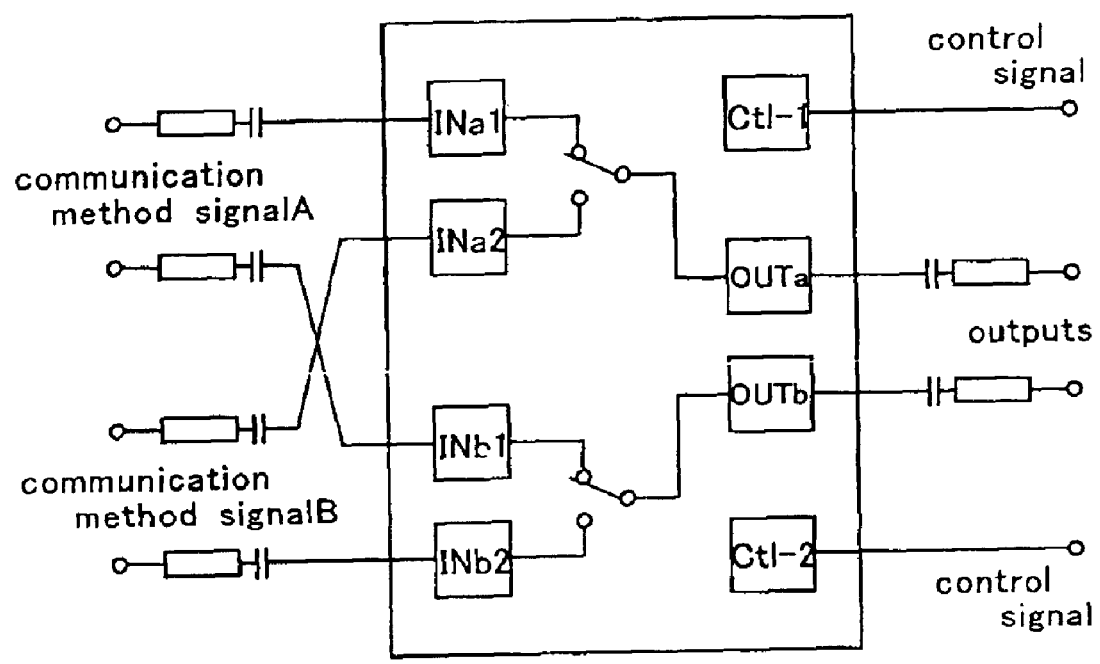
FIG. 20 is a diagram showing an application of the switching device of this invention.

FIG. 20 shows an application of the compound semiconductor switching circuit device of this invention. A pair of signals based on communication method A is applied to an input terminal pad (INa1) of a first switch and a input terminal pad (INb1) of a second switch. These two signals are called balanced signals, and have opposite phases (180 degree difference) from one another. Another pair of balanced signals based on communication method B is applied to other input terminal pads (INa2, INb2) of the first and second switches. Accordingly, the switching device of FIG. 20 can effectively alternate two pairs of balanced signals.

The configuration described above uses only one pair of the external electrodes (and corresponding terminal pads) for the control signals for manipulating two pairs of different signals. Thus, it makes it easier to reduce the chip size as well as the package size for the chip. It is expected that such a switching device will be suitable for the mobile applications including cell phone which requires both the CDMA and the GPS communication methods.

The design of the package is effective in reducing the package size because it does not employ a lead frame structure and has the external electrode disposed on the back side of the package. In comparison to the conventional package structure in which lead pins are sticking out horizontally from the package, the device of this invention requires less area on a circuit board for mounting.

The design of the chip is also effective in reducing its size because the resistor connecting the control terminal pad and the gate electrode is disposed between the row of the FETs and the row of the terminal pads. Furthermore, the wiring connecting the resistor and the gate electrode would have to be detoured to avoid intersecting the resistor when only one pair of control signals are used for controlling two pairs of signals. In the chip design above, this is avoided by disposing the wiring over the resistor, further contributing to the chip size reduction.

The above is a detailed description of particular embodiments of the invention. It is recognized that departures from the disclosed embodiments may be made within the scope of the invention and that obvious modifications will occur to a person skilled in the art. The full scope of the invention is set out in the claims that follow and their equivalents. Accordingly, the specification should not be construed to narrow the full scope of protection to which the invention is entitled.

What is claimed is:

1. A semiconductor switching circuit device formed on a substrate, comprising:
   a first, a second, a third and a fourth field-effect transistor, each of said transistors having
   a source electrode, a gate electrode and a drain electrode which are formed on a channel layer of the substrate;
   a first, a second, a third and a fourth input terminal pad corresponding to the first, second, third and fourth transistors, respectively, the source electrode or the drain electrode of each of the four transistors being connected to the corresponding input terminal pad thereof;
   a first common output terminal pad being electrically in direct contact with the source electrode or the drain electrode of the first transistor and being electrically in direct contact with the source electrode or the drain electrode of the second transistor, the two electrodes of the first and second transistors which are electrically in direct contact with the first common output terminal pad not being connected to any of the input terminal pads;
   a second common output terminal pad being electrically in direct contact with the source electrode or the drain electrode of the third transistor and being electrically in direct contact with the source electrode or the drain electrode of the fourth transistor, the two electrodes of the third and fourth transistors which are electrically in direct contact with the second common output terminal pad not being connected to any of the input terminal pads;
   a first control terminal pad connected to the gate electrodes of the first and third transistors; and
   a second control terminal pad connected to the gate electrodes of the second and fourth transistors.

2. The semiconductor switching circuit device of claim 1, wherein each of the gate electrodes forms a Schottky contact with the channel layer and each of the source electrodes and the drain electrodes forms an ohmic contact with the channel layer.

3. The semiconductor switching circuit device of claim 1, wherein the substrate is made of a compound semiconductor and each of the transistors is a metal-semiconductor field-effect transistor.

4. The semiconductor switching circuit device of claim 1, further comprising a first connection connecting the first control terminal pad and the gate electrode of the third transistor, wherein the four transistors are aligned in a direction forming a row of the first, second, third and fourth transistors in this order, and wherein the connection is disposed along the row of the transistors.

5. The semiconductor switching circuit device of claim 4, wherein the connection comprises a resistor formed between the first control terminal pad and the gate electrode of the third transistor.

6. The semiconductor switching circuit device of claim 5, wherein the substrate is made of a compound semiconductor and the resistor comprises a high dopant concentration region.

7. The semiconductor switching circuit device of claim 4, further comprising a second connection connecting the second control terminal pad and the gate electrode of the second transistor, wherein the two connections intersect each other.

8. The semiconductor switching circuit device of claim 7, wherein the first, second, third and fourth input terminal pads are disposed on one side of the device so that each of the pads is placed next to the corresponding transistor, wherein the first and second common output terminal pads and the first and second control terminal pads are disposed on a side of the device opposite the side of the device of the four input terminal pads so that the two control terminal pads are placed at both ends of said opposite side of the device and the two common output terminal pads are placed between the two control terminal pads, and wherein the first and second connections are disposed between the row of the four transistors and a row of the control terminal pads and the common output terminal pads.

9. The semiconductor switching circuit device of claim 4, wherein the first, second, third and fourth input terminal pads are disposed on one side of the device so that each of the pads is placed next to the corresponding transistor and wherein the first and second common output terminal pads and the first and second control terminal pads are disposed on a side of the device opposite the side of the device of the four input terminal pads so that the two control terminal pads are placed at both ends of said opposite side of the device and the two common output terminal pads are placed between the two control terminal pads.

10. The semiconductor switching circuit device of claim 8, wherein a portion of the first transistor and a portion of the second transistor are disposed between the first and second input terminal pads, and wherein a portion of the third transistor and a portion of the fourth transistor are disposed between the third and fourth input terminal pads.

11. The semiconductor switching circuit device of claim 4, wherein each of the gate electrodes forms a Schottky contact with the channel layer and each of the source electrodes and the drain electrodes forms an ohmic contact with the channel layer.

12. The semiconductor switching circuit device of claim 4, wherein the substrate is made of a compound semiconductor and each of the transistors is a metal-semiconductor field-effect transistor.

13. A semiconductor switching circuit device comprising:
    a first switch comprising two field-effect transistors each having a source electrode, a gate electrode, a drain electrode and an input terminal pad, and a common output terminal pad for the two transistors of the first switch, the source electrode or the drain electrode of each of the two transistors of the first switch being electrically in direct contact with the common output terminal pad of the first switch, and the source electrode or the drain electrode of each of the two transistors of the first switch which is not electrically in direct contact with the common output terminal pad of the first switch being connected to the input terminal pad thereof;

a second switch comprising two field-effect transistors each having a source electrode, a gate electrode, a drain electrode and an input terminal pad, and a common output terminal pad for the two transistors of the second switch, the source electrode or the drain electrode of each of the two transistors of the second switch being electrically in direct contact with the common output terminal pad of the second switch, and the source electrode or the drain electrode of each of the two transistors of the second switch which is not electrically in direct contact with the common output terminal pad of the second switch being connected to the input terminal pad thereof; and two control terminal pads, one of the two control terminal pads being connected to a gate electrode of one of the two transistors of the first switch and a gate electrode of one of the two transistors of the second switch, and another of said two control terminal pads being connected to a gate electrode of another of the two transistors of the first switch and a gate electrode of another of the two transistors of the second switch.

14. The semiconductor switching circuit device of claim 13, wherein each of the first and second switch comprises a single pole double throw switch.

15. A semiconductor switching circuit device comprising:

a first switch comprising two field-effect transistors each having a source electrode, a gate electrode, a drain electrode and an input terminal pad, and a common output terminal pad for the two transistors of the first switch, the source electrode or the drain electrode of each of the two transistors of the first switch being electrically in contact with the common output terminal pad of the first switch, and the source electrode or the drain electrode of each of the two transistors of the first switch which is not electrically in contact with the common output terminal pad of the first switch being connected to the input terminal pad thereof;

a second switch comprising two field-effect transistors each having a source electrode, a gate electrode, a drain electrode and an input terminal pad, and a common output terminal pad for the two transistors of the second switch, the source electrode or the drain electrode of each of the two transistors of the second switch being electrically in contact with the common output terminal pad of the second switch, and the source electrode or the dram electrode of each of the two transistors of the second switch which is not electrically in contact with the common output terminal pad of the second switch being connected to the input terminal pad thereof; and two control terminal pads, one of the two control terminal pads being connected to a gate electrode of one of the two transistors of the first switch and a gate electrode of one of the two transistors of the second switch, and another of said two control terminal pads being connected to a gate electrode of another of the two transistors of the first switch and a gate electrode of another of the two transistors of the second switch, wherein the four input terminal pads are configured to receive two pairs of balanced analog signals and the two common output terminal pads are configured to output one of the two pairs of balanced analog signals received by the four input terminal pads.

* * * * *